United States Patent
Williams et al.

(10) Patent No.: US 11,176,038 B2
(45) Date of Patent: Nov. 16, 2021

(54) CACHE-INHIBITED WRITE OPERATIONS

(71) Applicant: INTERNATIONAL BUSINESS MACHINES CORPORATION, Armonk, NY (US)

(72) Inventors: Derek E. Williams, Round Rock, TX (US); Guy L. Guthrie, Austin, TX (US); Hugh Shen, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 113 days.

(21) Appl. No.: 16/588,241

(22) Filed: Sep. 30, 2019

(65) Prior Publication Data
US 2021/0096990 A1    Apr. 1, 2021

(51) Int. Cl.
| G06F 12/0811 | (2016.01) |
| G06F 12/0846 | (2016.01) |
| G11C 11/409 | (2006.01) |
| G06F 13/16 | (2006.01) |
| G06F 9/54 | (2006.01) |

(52) U.S. Cl.
CPC .......... *G06F 12/0811* (2013.01); *G06F 9/542* (2013.01); *G06F 12/0846* (2013.01); *G06F 13/1652* (2013.01); *G06F 13/1668* (2013.01); *G11C 11/409* (2013.01)

(58) Field of Classification Search
CPC .................................................. G06F 12/0811
USPC ........................................................ 711/122
See application file for complete search history.

(56) References Cited

U.S. PATENT DOCUMENTS

| 4,306,298 A | 12/1981 | McElroy |
| 4,443,864 A | 4/1984 | McElroy |
| 5,191,656 A | 3/1993 | Forde, III et al. |
| 5,490,253 A | 2/1996 | Laha et al. |
| 5,978,874 A | 11/1999 | Singhal et al. |
| 6,209,053 B1 | 3/2001 | Kurts |

(Continued)

FOREIGN PATENT DOCUMENTS

| CN | 102216898 A | 10/2011 |
| CN | 105183662 A | 12/2015 |
| CN | 109947363 A | 6/2019 |

OTHER PUBLICATIONS

International Business Machines Corporation, International Filing Date: Aug. 20, 2020, International application No. PCT/IB2020/057835—ISR/WO (International Search Report and Written Opinion) dated Dec. 9, 2020.

*Primary Examiner* — Jae U Yu
(74) *Attorney, Agent, or Firm* — Brian F. Russell; Nathan Rau

(57) ABSTRACT

A data processing system includes multiple processing units coupled to a system interconnect including a broadcast address interconnect and a data interconnect. The processing unit includes a processor core that executes memory access instructions and a cache memory, coupled to the processor core, which is configured to store data for access by the processor core. The processing unit is configured to broadcast, on the address interconnect, a cache-inhibited write request and write data for a destination device coupled to the system interconnect. In various embodiments, the initial cache-inhibited request and the write data can be communicated in the same or different requests on the address interconnect.

17 Claims, 8 Drawing Sheets

(56) References Cited

U.S. PATENT DOCUMENTS

| | | | |
|---|---|---|---|
| 6,393,500 B1 | 5/2002 | Thekkath | |
| 8,095,733 B2 | 1/2012 | Arimilli et al. | |
| 2003/0167313 A1* | 9/2003 | Brown | G06F 9/445 |
| | | | 709/215 |
| 2008/0140938 A1* | 6/2008 | Khemani | H04L 67/2842 |
| | | | 711/133 |
| 2010/0257317 A1 | 10/2010 | Arimilli et al. | |

* cited by examiner

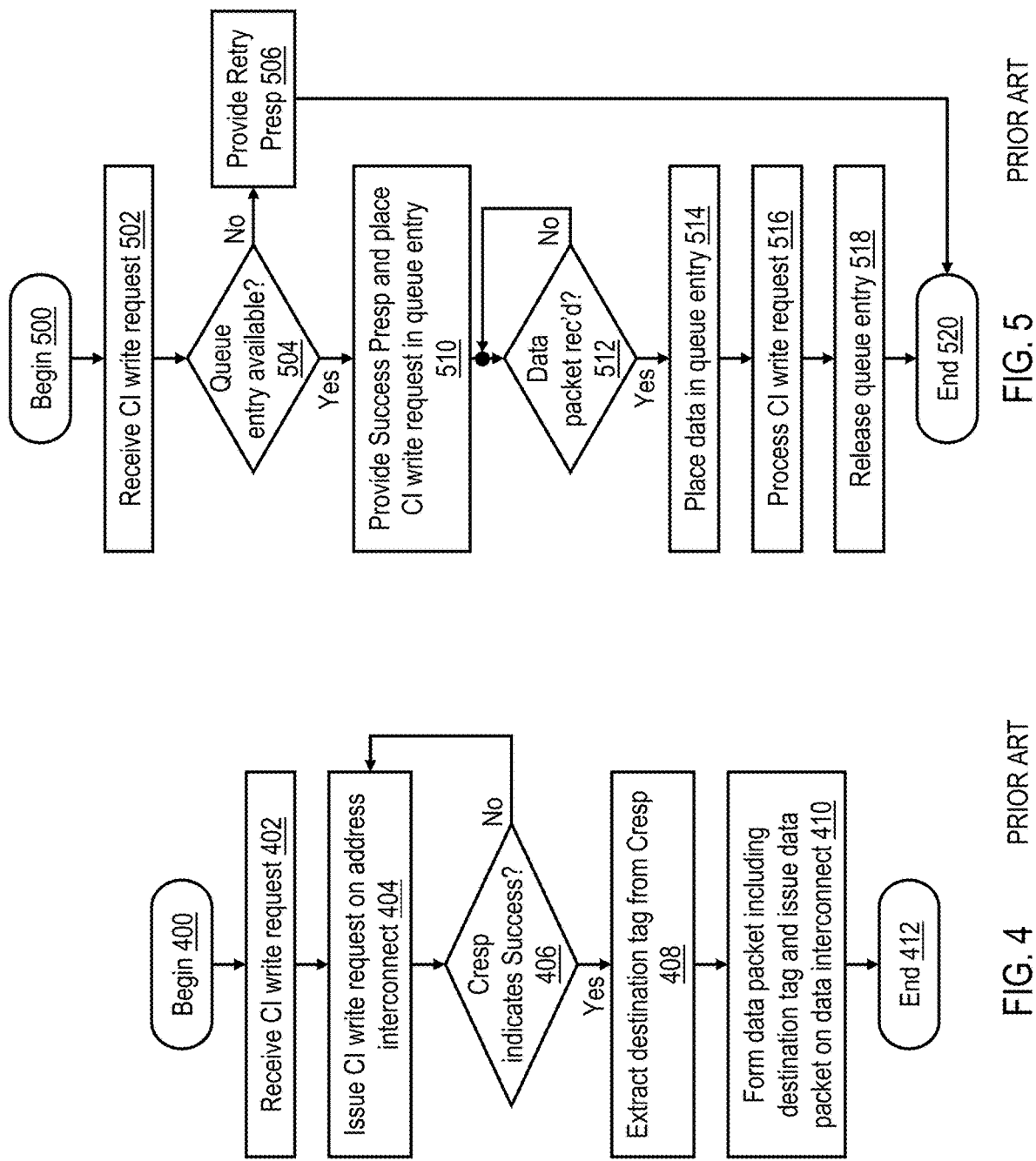

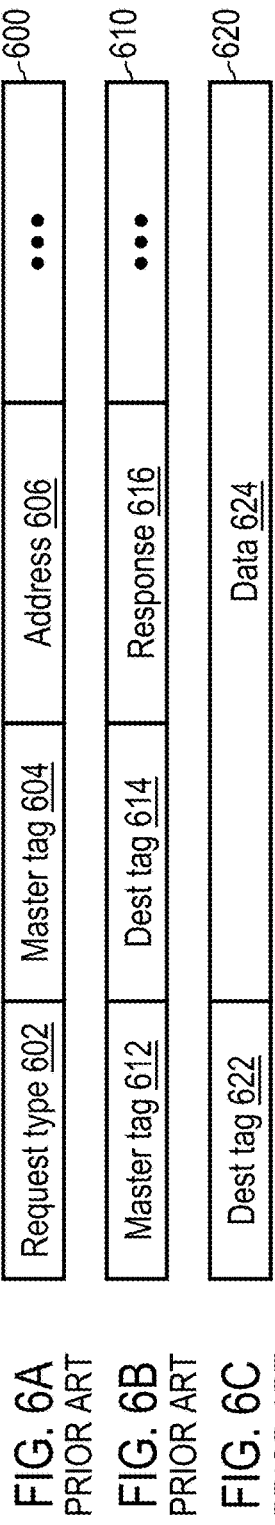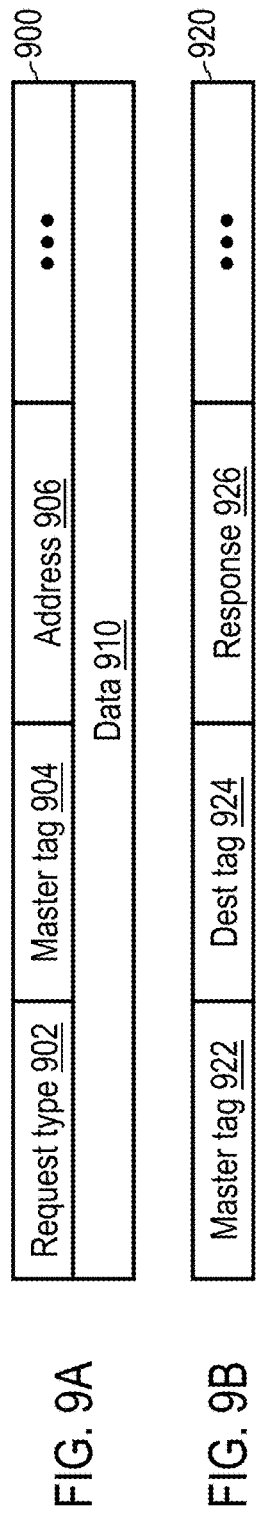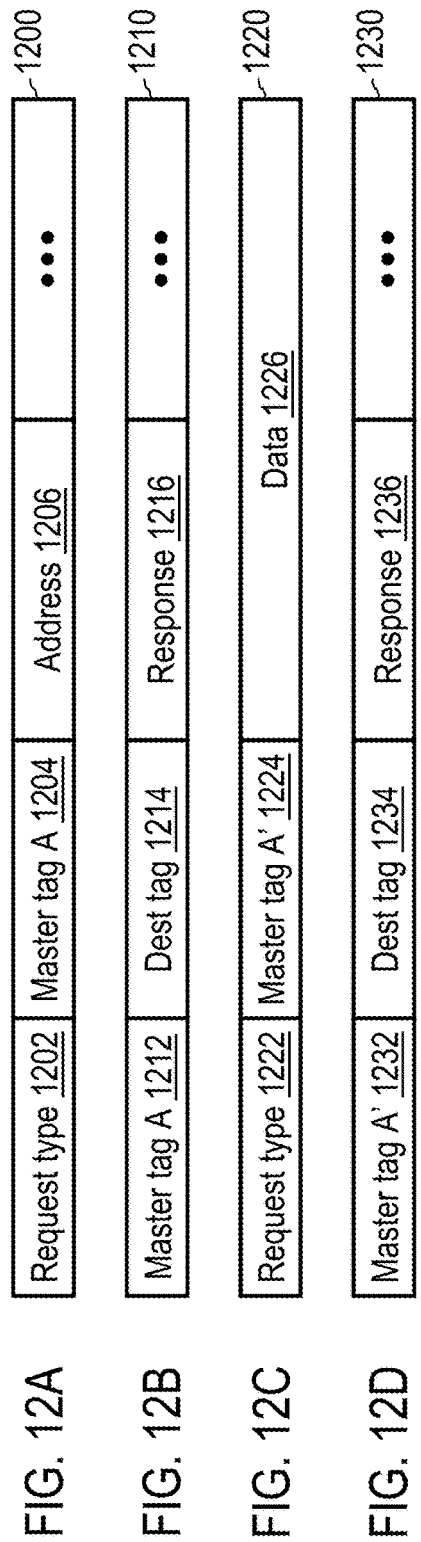

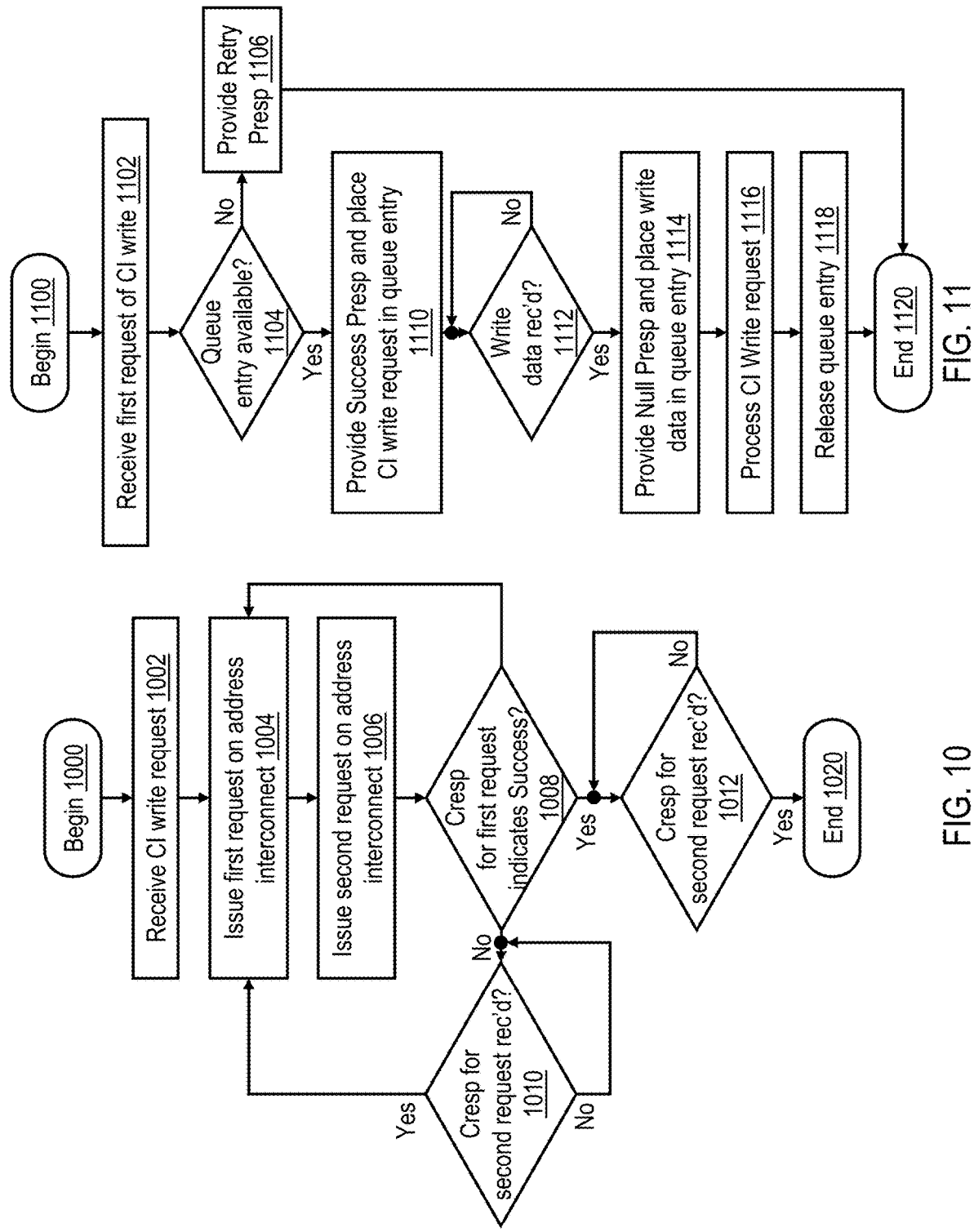

CACHE-INHIBITED WRITE OPERATIONS

BACKGROUND OF THE INVENTION

The present invention relates in general to data processing system and, in particular, to write operations in a data processing system. Still more particularly, the present invention relates to a cache-inhibited write operations in a data processing system.

In shared memory multiprocessor (MP) data processing systems, each of the multiple processors in the system may generally access and modify data stored in the shared memory. In order to reduce the access latency to data stored in the shared memory, processors are typically equipped with high speed local caches that buffer data retrieved from the shared memory that is likely to be accessed by the processors. A coherent view of the data held in the various local caches of the processors is maintained through the implementation of a coherence protocol.

In such shared memory MP systems, it is common for certain addresses in the address space to be designated as cache-inhibited (non-cacheable), for example, by an appropriate setting in a page table in the shared memory. Data associated with these cache-inhibited addresses are ineligible for caching in the local caches of the processors. By restricting caching of the data for the cache-inhibited addresses, maintenance of a single coherent view of the contents of the corresponding memory locations is greatly simplified in that modification of the data associated with a cache-inhibited address does not require the invalidation of any older copy or copies of the data residing in the local caches of the processors.

BRIEF SUMMARY

In one or more embodiments, a write to a cache-inhibited address is expedited by broadcasting the write data on an address interconnect of a data processing system.

For example, in at least one embodiment, a data processing system includes multiple processing units coupled to a system interconnect including a broadcast address interconnect and a data interconnect. The processing unit includes a processor core that executes memory access instructions and a cache memory, coupled to the processor core, which is configured to store data for access by the processor core. The processing unit is configured to broadcast, on the address interconnect, a cache-inhibited write request and write data for a destination device coupled to the system interconnect. In various embodiments, the initial cache-inhibited request and the write data can be communicated in the same or different requests on the address interconnect.

BRIEF DESCRIPTION OF THE SEVERAL VIEWS OF THE DRAWINGS

FIG. 4 is a high-level logical flowchart of a prior art method by which a non-cacheable unit (NCU) issues, on a system interconnect of a data processing system, a cache-inhibited (CI) write request;

FIG. 5 is a high-level logical flowchart of a prior art method by which a destination device services a CI write request;

FIG. 6A-6C respectively illustrate a CI write request, coherence response message, and data packet in accordance with the prior art;

FIG. 9A-9B respectively illustrate a CI write request and a coherence response message in accordance with one embodiment;

FIG. 10 is a high-level logical flowchart of an exemplary method by which an NCU issues, on a system interconnect of a data processing system, a CI write request in accordance with another embodiment;

FIG. 11 is a high-level logical flowchart of an exemplary method by which a destination device services a CI write request in accordance with another embodiment;

FIG. 12A-12D respectively illustrate a first request, a first coherence response message, a second request, and a second coherence response message for a CI write operation in accordance with another embodiment.

DETAILED DESCRIPTION

Figure 1:
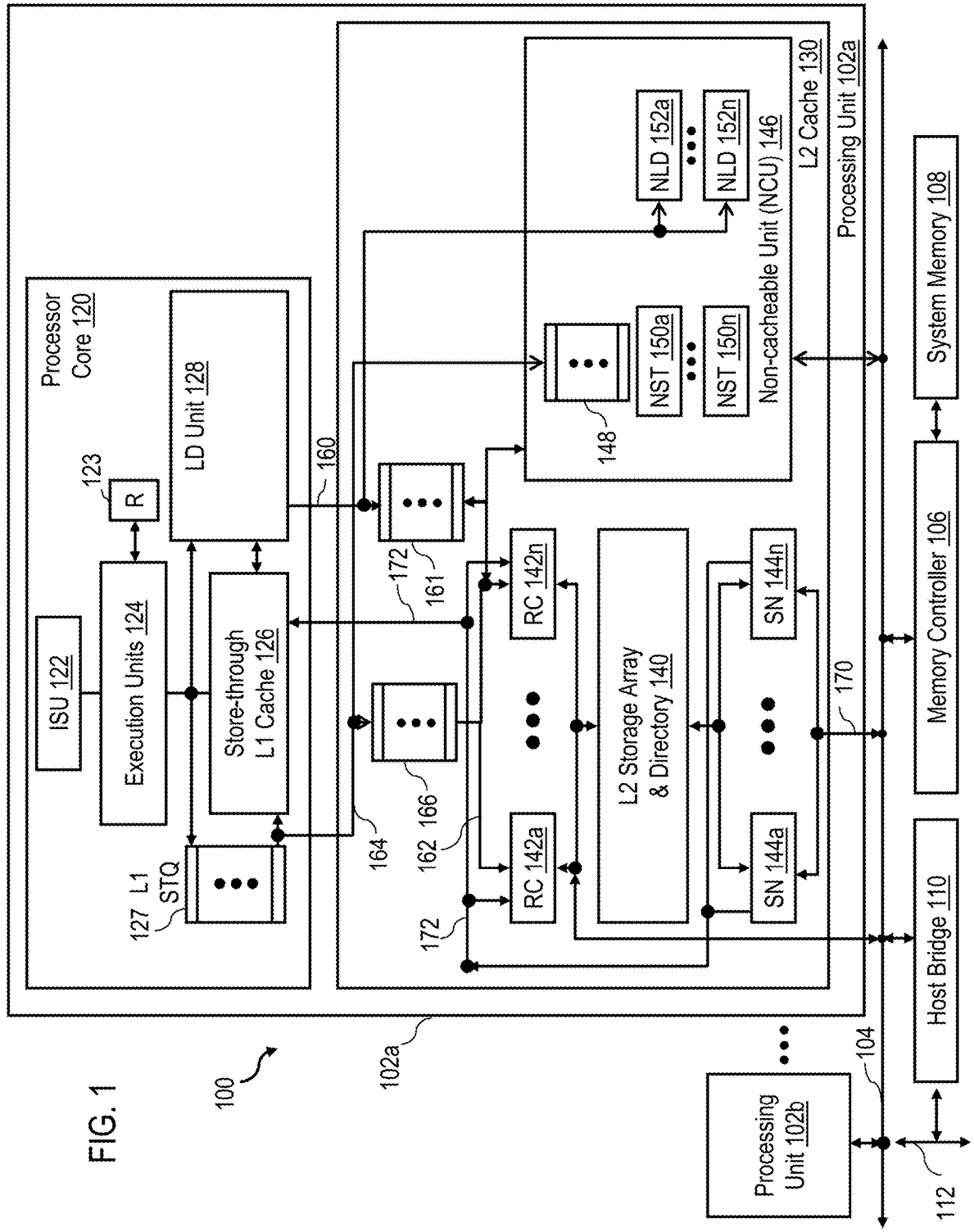
FIG. 1 is a high-level block diagram of an illustrative data processing system in accordance with one embodiment.
Figure 3:
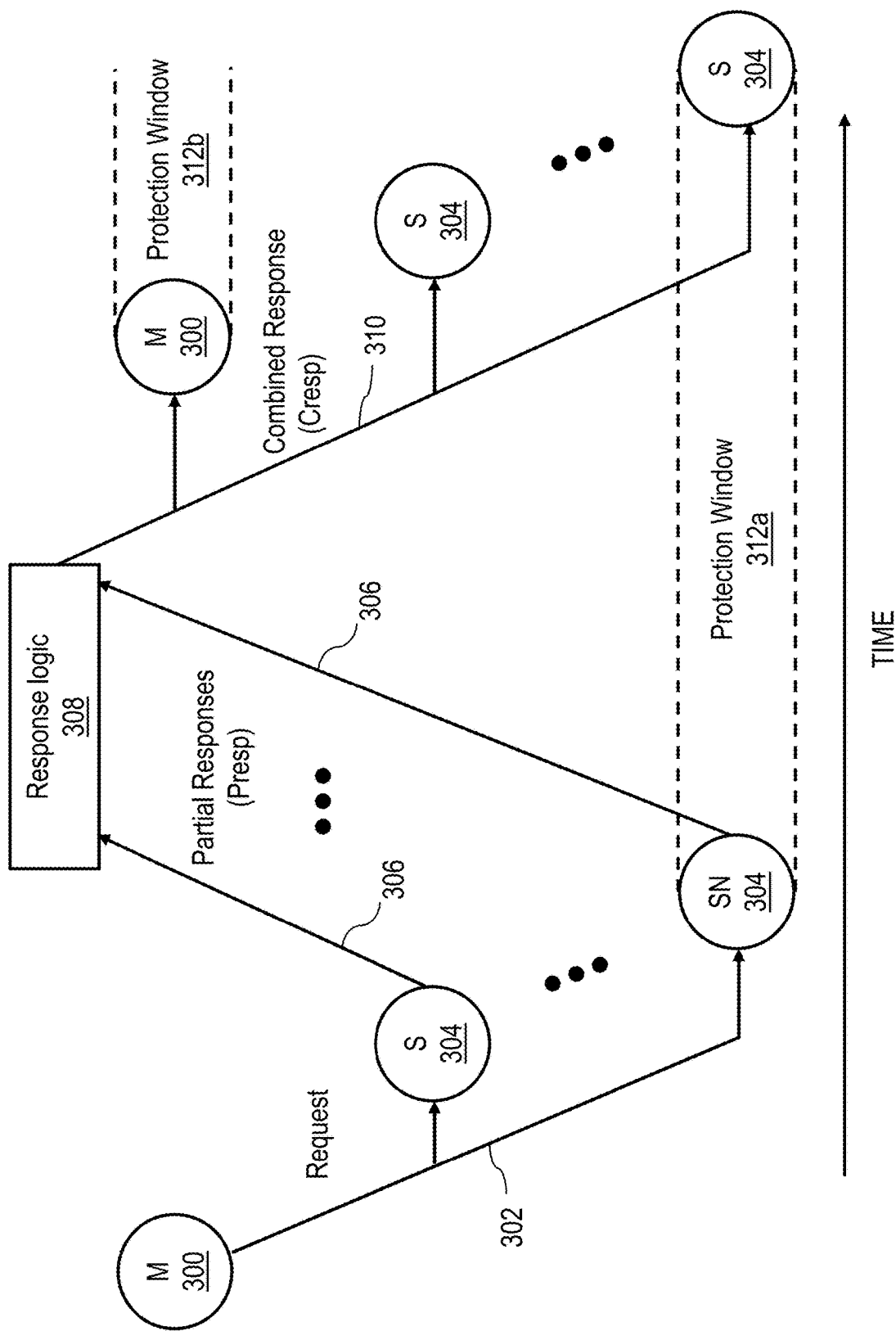
FIG. 3 is a time-space diagram of an exemplary operation on the system interconnect of a data processing system in accordance with one embodiment.

With reference now to the figures and in particular with reference to FIG. 1, there is illustrated a high level block diagram of a data processing system 100 in accordance with one embodiment. As shown, data processing system 100 includes multiple processing units 102 (including at least processing units 102*a*-102*b*) for processing data and instructions. Processing units 102 are coupled for communication to a system interconnect 104 for conveying address, data and control information between attached devices. In a preferred embodiment, system interconnect 104 includes bifurcated address and data interconnects. It is additionally preferred if the address interconnect, which conveys requests and coherence responses as described further below with reference to FIG. 3, is a broadcast interconnect, such as an address bus, that conveys all requests and coherence responses to all attached devices. In contrast, it is preferred if the data interconnect is a point-to-point interconnect, such as a switch, that supports direct source-to-destination communication of data.

In the depicted embodiment, the devices coupled to system interconnect 104 include not only processing units 102, but also a memory controller 106 providing an interface to a shared system memory 108 and one or more host bridges 110, each providing an interface to a respective mezzanine bus 112. Mezzanine bus 112 in turn provides slots for the attachment of additional unillustrated devices, which may include network interface cards, I/O adapters, non-volatile memory, non-volatile storage device adapters, additional bus bridges, etc.

As further illustrated in FIG. 1, each processing unit 102, which may be realized as a single integrated circuit, includes one or more processor cores 120 (of which only one is explicitly shown) for processing instructions and data. Each processor core 120 includes an instruction sequencing unit (ISU) 122 for fetching and ordering instructions for execution, one or more execution units 124 for executing instructions dispatched from ISU 122, and a set of registers 123 for temporarily buffering data and control information. The instructions executed by execution units 124 include memory access instructions, such as load and store instructions that read and write data associated with cacheable and non-cacheable addresses.

Each processor core 120 further includes an L1 store queue (STQ) 127 and a load unit 128 for managing the completion of store and load requests, respectively, corresponding to executed store and load instructions. In one embodiment, L1 STQ 127 may be implemented as a First-In, First-Out (FIFO) queue containing a plurality of queue entries. Store requests are accordingly loaded in the "top" entry of L1 STQ 127 at execution of the corresponding store instruction to determine the target address, and are initiated when the store request reaches the "bottom" or "commit" entry of L1 STQ 127.

It is important to note that the present application makes a distinction between "instructions", such as load and store instructions, and "requests." Load and store "instructions" are defined herein as inputs to an execution unit that include an request code (opcode) identifying the type of instruction and one or more operands specifying data to be accessed and/or its address. Load and store "requests" are defined herein as data and/or signals generated following instruction execution that specify at least the target address of data to be accessed. Thus, load and store requests may be transmitted from a processor core 120 to the memory system to initiate data accesses, while load and store instructions are not.

The operation of processor core 120 is supported by a multi-level volatile memory hierarchy having, at its lowest level, shared system memory 108, and at its upper levels two or more levels of cache memory, which in the illustrative embodiment include a L1 cache 126 and a L2 cache 130. As in other shared memory multiprocessor data processing systems, the cacheable contents of the memory hierarchy may generally be accessed and modified by threads of execution executing in any processor core 120 in any processing unit 102 of data processing system 100.

In accordance with one embodiment, L1 cache 126 is implemented as a store-through cache, meaning that the point of cache coherency with respect to other processor cores 120 is located below L1 cache 126 and, in the depicted embodiment, is located at store-in L2 cache 130. Accordingly, L1 cache 126 does not maintain true cache coherency states (e.g., Modified, Exclusive, Shared, Invalid) for its cache lines, but only maintains valid/invalid bits. Because L1 cache 126 is implemented as a store-through cache, store requests first complete relative to the associated processor core 120 in L1 cache 126 and then complete relative to other processing units 102 at a point of system-wide coherency, which in the depicted embodiment is L2 cache 130.

As further illustrated in FIG. 1, L2 cache 130 contains a storage array and directory 140 that store cache lines of instructions and data in association with their respective memory addresses and coherence states. L2 cache 130 also includes a number of read-claim (RC) state machines 142a-142n for independently and concurrently servicing cacheable memory access requests received from the associated processor cores 120. RC machines 142 receive core load requests from LD unit 128 in processor core 120 via load bus 160, an in-order L2 load queue (LDQ) 161, and command bus 162. Similarly, RC machines 142 receive core store requests from L1 STQ 127 in processor core 120 via store bus 164, an in-order L2 store queue (STQ) 166, and command bus 162.

L2 cache 130 further includes a number of snoop (SN) state machines 144a-144n for servicing cacheable memory access and other requests received from other processing units 102 via system interconnect 104 and snoop bus 170. SN machines 144 and RC machines 142 are each connected to a back-invalidation bus 172 by which any SN machine 144 or RC machine 142 can signal the invalidation of a cache line to processor core 120.

In at least one embodiment, L2 cache 130 is constructed such that at most a single one of RC machines 142 and SN machines 144 can be active servicing a request targeting a given target cache line address at any one time. Consequently, if a second request is received while a first request targeting the same cache line is already being serviced by an active RC machine 142 or SN machine 144, the later-in-time second request must be queued or rejected until servicing of the first request is completed and the active state machine returns to an idle state.

L2 cache 130 additionally includes a non-cacheable unit (NCU) 146 for servicing cache-inhibited (CI) memory access requests received from processor core 120. NCU 146 includes a number of NCU store (NST) state machines 150a-150n for independently and concurrently servicing memory access requests received from the associated processor cores 120 that target non-cacheable addresses. NST machines 150 receive core CI write requests from L1 STQ 127 in processor core 120 via store bus 164 and an in-order NCU store queue (NSQ) 148. Additionally, NCU 146 includes a number of NCU load (NLD) state machines 152a-152n that receive core CI read requests from LD unit 128 in processor core 120 via load bus 160.

Those skilled in the art will additionally appreciate that data processing system 100 of FIG. 1 can include many additional non-illustrated components, such as interconnect bridges, non-volatile storage, ports for connection to networks or attached devices, etc. Because such additional components are not necessary for an understanding of the described embodiments, they are not illustrated in FIG. 1 or discussed further herein. It should also be understood, however, that the enhancements described herein are applicable to data processing systems of diverse architectures and are in no way limited to the generalized data processing system architecture illustrated in FIG. 1. For example, although FIG. 1 illustrates an embodiment including a distinct NCU for servicing cache-inhibited requests, other architectures may service cache-inhibited requests such as CI writes, utilizing other logic, such as cache logic within L2 cache 130.

Figure 2:
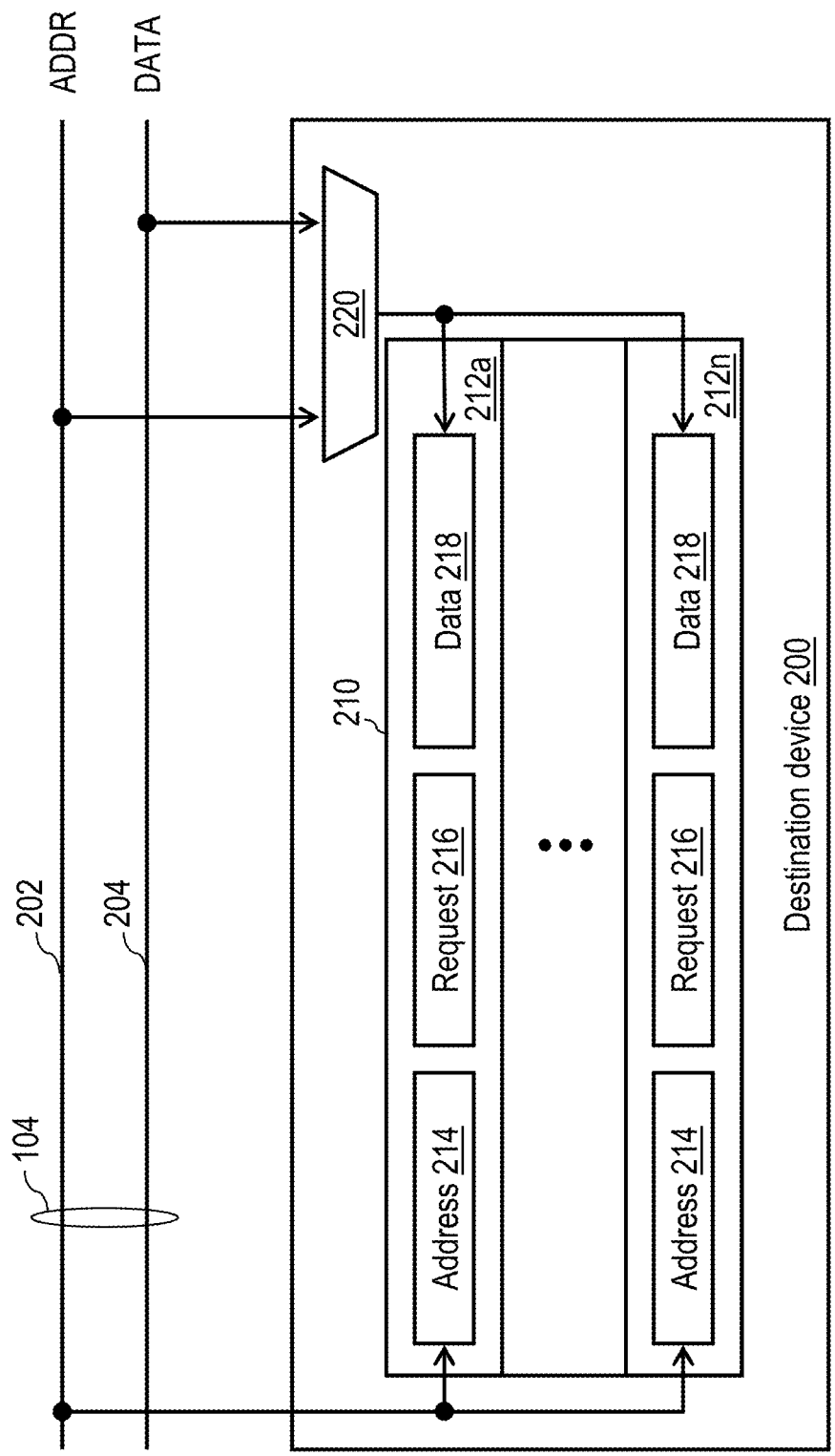
FIG. 2 is a more detailed view of a destination device within the data processing system of FIG. 1 in accordance with one embodiment.

Referring now to FIG. 2, there is depicted a more detailed view of a destination device 200 in accordance with one embodiment. Destination device 200 can be any device coupled to system interconnect 104 that can serve as the destination (target) of a CI write request. For example, in the embodiment of FIG. 1, destination device 200 can be a host bridge 110 or memory controller 106.

In the depicted embodiment, destination device 200 is coupled to both an address interconnect 202 and a data interconnect 204 forming system interconnect 104. As noted above, address interconnect 202 is preferably a broadcast interconnect such as a bus, meaning that each attached device has visibility to all requests and coherence messages transmitted on address interconnect 202. Data interconnect 204, on the other hand, is preferably implemented as a point-to-point interconnect, meaning that while the data packet is routed the data packet may pass by multiple (but typically not all) snoopers, only the destination of an operation receives and processes a data packet transmitted on data interconnect 204. In the depicted embodiment, destination device 200 includes, among other components, a request queue 210 having a plurality of queue entries 212a-212n for buffering requests received on address interconnect 202. Each queue entry 212 includes at least an address field 214 for buffering a destination (target) address of the request, a request field 216 for buffering an indication of the request type (e.g., read, write, etc.), and a data field 218 for buffering data associated with the request. As further illustrated in FIG. 2, destination device 200 also includes selection logic 220 (represented as a multiplexer) that is capable of selecting the information placed in data fields 218 from both address interconnect 202 and data interconnect 204.

With reference now to FIG. 3, there is illustrated a time-space diagram of an exemplary operation on the system interconnect 104 of data processing system 100 in accordance with one embodiment. The operation begins when a master 300, such as an RC machine 142 or an NST machine 150, issues a request 302 on address interconnect 202 of data processing system 100. Request 302 preferably includes a transaction type indicating a type of desired access and a resource identifier (e.g., target real address) indicating a resource to be accessed by the request. Common types of requests preferably include those set forth below in Table I.

TABLE I

| Request | Description |
| --- | --- |
| READ | Requests a copy of the image of a memory block for query purposes |
| RWITM (Read-With-Intent-To-Modify) | Requests a unique copy of the image of a memory block with the intent to update (modify) it and requires destruction of other copies, if any |
| DCLAIM (Data Claim) | Requests authority to promote an existing query-only copy of memory block to a unique copy with the intent to update (modify) it and requires destruction of other copies, if any |
| DCBZ (Data Cache Block Zero) | Requests authority to create a new unique copy of a memory block without regard to its present state and subsequently modify its contents; requires destruction of other copies, if any |
| CASTOUT | Copies the image of a memory block from a higher level of memory to a lower level of memory in preparation for the destruction of the higher level copy |
| WRITE | Requests destruction of cached copies, if any, of a memory block and authority to update the memory block |

Request 302 is received by snoopers 304, such as destination devices 200 (e.g., host bridge 110 and memory controller 106) and the SN machines 144 of L2 caches 130. In general, with some exceptions, the SN machines 144 in the same L2 cache 130 as a master that initiates a request 302 do not snoop that request 302 (i.e., there is generally no self-snooping) because a request 302 is transmitted on address interconnect 202 only if the request 302 cannot be serviced internally by a processing unit 102.

In response to receipt of request 302, snoopers 304 may provide respective partial responses (Presps) 306 on address interconnect 202, where each Presp 306 represents the coherence response of at least that snooper 304 to request 302. A destination device 200 determines its partial response 306, if any, based, for example, on whether destination device 200 is responsible for the request address and whether the destination device 200 has resources available to service the request. An L2 cache 130 may determine its partial response 306 based on, for example, the availability of its L2 storage array and directory 140, the availability of resources to handle the request (including an available SN machine 144), and the cache state associated with the request address in L2 storage array and directory 140.

The partial responses of the various snoopers 304 are logically combined either in stages or all at once by one or more instances of response logic 308 to determine a system-wide combined response (Cresp) 310 to request 302. Response logic 308 provides combined response 310 to master 300 and snoopers 304 via address interconnect 202 to indicate the system-wide response (e.g., Success, Retry, etc.) to request 302. If combined response 310 indicates success of request 302, combined response 310 may indicate, for example, a destination for write data (if applicable), a cache state in which the requested memory block is to be cached by master 300 (if applicable), and/or whether "cleanup" operations invalidating the requested memory block in one or more caches 126, 130 are required (if applicable).

In response to receipt of combined response 310, one or more of master 300 and snoopers 304 typically perform one or more operations in order to service request 302. These operations may include supplying data to master 300, invalidating or otherwise updating the cache state of data cached in one or more caches 126, 130, performing castout operations, writing data to a system memory 108 or an I/O device, etc. As discussed further below, data may be transmitted to or from master 300 before or after the generation of combined response 310 by response logic 210. In general, for most operations, the data associated with an operation on system interconnect 104 is transmitted via data interconnect 204. However, in at least some embodiments, for some operations the data is transmitted via address interconnect 202, as described further herein.

The partial response provided by a snooper 304 in response to a request and the operations performed the snooper in response to the request and/or its combined response can depend on whether that snooper is a Highest Point of Coherency (HPC), a Lowest Point of Coherency (LPC), or neither with respect to the target address specified by the request. An LPC is defined herein as a memory device or I/O device that serves as the repository for a memory block. In the absence of a HPC for the memory block, the LPC holds the true image of the memory block and has authority to grant or deny requests to generate an additional cached copy of the memory block. For a typical request in the data processing system embodiment of FIGS. 1 and 2, the LPC will be the memory controller 106 for the system memory 108 serving as a repository for the referenced memory block or the host bridge 110 responsible for the memory-mapped I/O address. An HPC is defined herein as a uniquely identified device that caches a true image of the memory block (which may or may not be consistent with the corresponding memory block at the LPC) and has the authority to grant or deny a request to modify the memory block. Descriptively, the HPC may also provide a shared copy of the memory block to a requestor in response to an operation that does not modify the memory block. Thus, for a typical request in the data processing system embodiment of FIGS. 1 and 2, the HPC, if any, will be an L2 cache 230. Although other indicators may be utilized to designate an HPC for a memory block, a preferred embodiment of the present invention designates the HPC, if any, for a memory block utilizing selected cache state(s) within the directory of an L2 cache 130.

Still referring to FIG. 3, the HPC, if any, for a memory block referenced in a request 302, or in the absence of an HPC, the LPC of the memory block, preferably has the responsibility of protecting the transfer of coherence ownership of a memory block in response to a request 402 during a protection window 312a. In the exemplary scenario shown in FIG. 3, the snooper 304 that is the HPC for the memory block specified by the request address of request 302 protects, if necessary, the transfer of ownership of the requested memory block to master 300 during a protection window 312a that extends at least from the time that snooper 304 determines its partial response 306 until snooper 304 receives combined response 310 (and possibly thereafter). During protection window 312a, snooper 304 protects the transfer of ownership by providing partial responses 306 (e.g., Retry Presps) to other requests specifying the same request address that prevent other masters from obtaining coherence ownership until such ownership has been successfully transferred to master 300. Master 300 may likewise initiate a protection window 312b to protect its ownership of the memory block requested in request 302 following receipt of combined response 310.

Because snoopers 304 all have limited resources for handling the CPU and I/O requests described above, several different levels of partial responses and corresponding combined responses are possible. For example, if a memory controller 106 that is responsible for a requested memory block has a queue entry available to handle a request, the memory controller 106 may respond with a partial response indicating that it is able to serve as the LPC for the request. If, on the other hand, the memory controller 106 has no queue entry available to handle the request, the memory controller 106 may respond with one or more partial responses indicating that is the LPC for the memory block, but is unable to currently service the request. Similarly, an L2 cache 130 may require an available SN machine 144 and access to L2 storage array and directory 140 in order to handle a snooped request 302. Absence of access to either (or both) of these resources results in a partial response (and corresponding CR) signaling an inability to service the request due to absence of a required resource (e.g., a Retry).

Referring now to FIG. 4, there is a high-level logical flowchart of a prior art method by which a non-cacheable unit (NCU) issues, on a system interconnect of a data processing system, a cache-inhibited (CI) write request. To promote understanding, the prior art method of FIG. 4 will be described with reference to exemplary data processing system 100 of FIG. 1 and the exemplary operation depicted in FIG. 3.

The process of FIG. 4 begins at block 400 and then proceeds to block 402, which illustrates an NST machine 150 of an NCU 146 receiving a CI write request from the associated processor core 120 via store bus 164 and NSQ 148. The CI write request is generated, for example, by execution of a corresponding store instruction by processor core 120 targeting a region of cache-inhibited memory, and includes at least a target address and write data.

In response to receipt of the CI write request, the NST machine 150 issues the CI write request on address interconnect 202 (block 404). As shown in FIG. 6A, the CI write request 600 includes at least a request type field 602 identifying the request as a CI write request, a master tag field 604 identifying the processing unit 102, NCU 146, and NST machine 150 issuing the CI write request, and an address field 606 specifying the target address provided by the associated processor core 120.

In response to the CI write request, snoopers 304 within data processing system 100 provide respective partial responses (Presps) 306, as described above with reference to FIG. 3. These partial responses 306 are logically combined, and an instance of response logic 308 (e.g., residing in the issuing processing unit 102) forms a combined response (Cresp) 310 for the CI write request based on the partial responses 306. Caching snoopers typically generate Null partial responses for cache-inhibited requests and perform no additional processing for the cache-inhibited requests.

FIG. 6B illustrates an example of a format of a coherence response 610 that can be employed for both Presps 306 and Cresp 310. Coherence response 610 includes a master tag field 612, which identifies the processing unit 102, NCU 146, and NST machine 150 issuing the CI write request. In addition, coherence response 610 includes a destination tag field 614, which for Presps 306 and for Cresp 310 of a CI write request indicates the snooper 304 (and more precisely, the destination device 200 and queue entry 212) that is the destination of the CI write data (e.g., memory controller 106 or host bridge 110). For Presps 306, destination tag field 614 is unaltered by snoopers 304 that are not the ultimate destination of the CI write data. Coherence response 610 also includes a response field 616, which for Presps 306 indicates the accumulated coherence responses of snoopers 304 (i.e., the partial responses of snoopers 304 to a request can be ORed together within response field 616) and which for Cresp 310 indicates the systemwide coherence response to the CI write request based on the partial responses 306. The possible coherence responses indicated in response field 616 for the Cresp 310 of the CI write request include, for example, Success or Retry.

Returning to FIG. 4, at block 406 the NST machine 150 that issued the CI write request monitors for the associated Cresp 310 (as identified by master tag field 612 of the coherence response 610) and determines whether response field 616 of the Cresp 310 indicates success of the CI write request. If not (e.g., Cresp 310 indicates Retry in response field 616), the process returns to block 404, which illustrates NST machine 150 reissuing the CI write request on address interconnect 202. In response to NST machine 150 instead determining at block 406 that the Cresp 310 indicates success of the CI write request, NST machine 150 extracts the destination tag identifying the relevant destination device 200 and queue entry 212 from destination tag field 614 of Cresp 310 (block 408). NST machine 150 first forms the data packet for the CI write (block 410). As shown in FIG. 6C, the data packet 620 includes a destination tag field 622 including the destination tag information extracted from destination tag field 614 of Cresp 310, as well as a data field 624 containing the write data received from processor core 120. As further indicated in block 410, NST machine 150 then transmits the data packet to the relevant destination device 200 via point-to-point data interconnect 204. Thereafter, the process of FIG. 4 ends at block 412.

With reference now to FIG. 5, there is illustrated a high-level logical flowchart of a prior art method by which a destination device 200 (e.g., memory controller 106 or host bridge 110) services a CI write request. The process of FIG. 5 begins at block 500 and then proceeds to block 502, which illustrates the destination device 200 receiving a CI write request 600 specifying within address field 606 a target address for which the destination device 200 is responsible. In response to receipt of the CI write request 600, destination device 200 determines whether or not a queue entry 212 is available in its request queue 210 for allocation to the CI write request (block 504). If not, destination device 200 provides a Presp 306 indicating Retry in response field 616 (block 506). This Presp 306 will cause the relevant instance of response logic 308 to generate a Cresp 310 also indicating Retry in response field 616. Following block 506, the process of FIG. 5 ends at block 520.

Returning to block 504, in response to a determination that an entry 212 is available in request queue 210 for the CI write request, destination device 200 provides a Presp 306 indicating Success in response field 616 and enqueues the CI write request in the available entry 212 of request queue 210 by loading the address specified in address field 606 of CI write request 600 in address field 214 and loading an indication of the contents of request type field 602 into request field 216 (block 510). As shown at block 512, destination device 200 then monitors for receipt of the data packet 620 of the CI write request via data interconnect 204. In response to receipt of the data packet 620 of the CI write request, the destination device 200 identified by the destination tag field 622 extracts the data from data field 624 and loads the data into data field 218 (block 514). Destination device 200 then processes the CI write request, for example, by storing the data into system memory 108 or writing the data to an attached I/O device (block 516). Thereafter, destination device 200 releases the queue entry 212 (block 518), and the process of FIG. 5 ends at block 520.

The present disclosure appreciates that the prior art process of performing a CI write operation as represented by FIGS. 4-5 is inefficient in that the queue entry 212 allocated to the CI write operation remains occupied but performs no useful work between allocation and subsequent receipt of data packet 620. The present disclosure recognizes that because system resources like queue entries 212 are necessarily limited, it would be preferable if these limited resources were utilized more efficiently in a CI write operation by reducing the time that such resources are consumed by unproductive waiting. The present disclosure also appreciates that the latency of data delivery for cache-inhibited write operations can, in many cases, determine the critical performance path for a program, which may, for example, initiate processing by an I/O device through a CI write operation. Accordingly, the present application discloses multiple techniques for accelerating CI write operations through the use of the broadcast address interconnect 202 to communicate write data of the CI write operations. A first embodiment that employs a multi-beat CI write request to communicate write data via address interconnect 202 is disclosed with reference to FIGS. 7, 8, and 9A-9B. A second embodiment that utilizes a separate request on address interconnect 202 to communicate write data is disclosed with reference to FIGS. 10, 11, and 12A-12D.

Figures 7, 8:
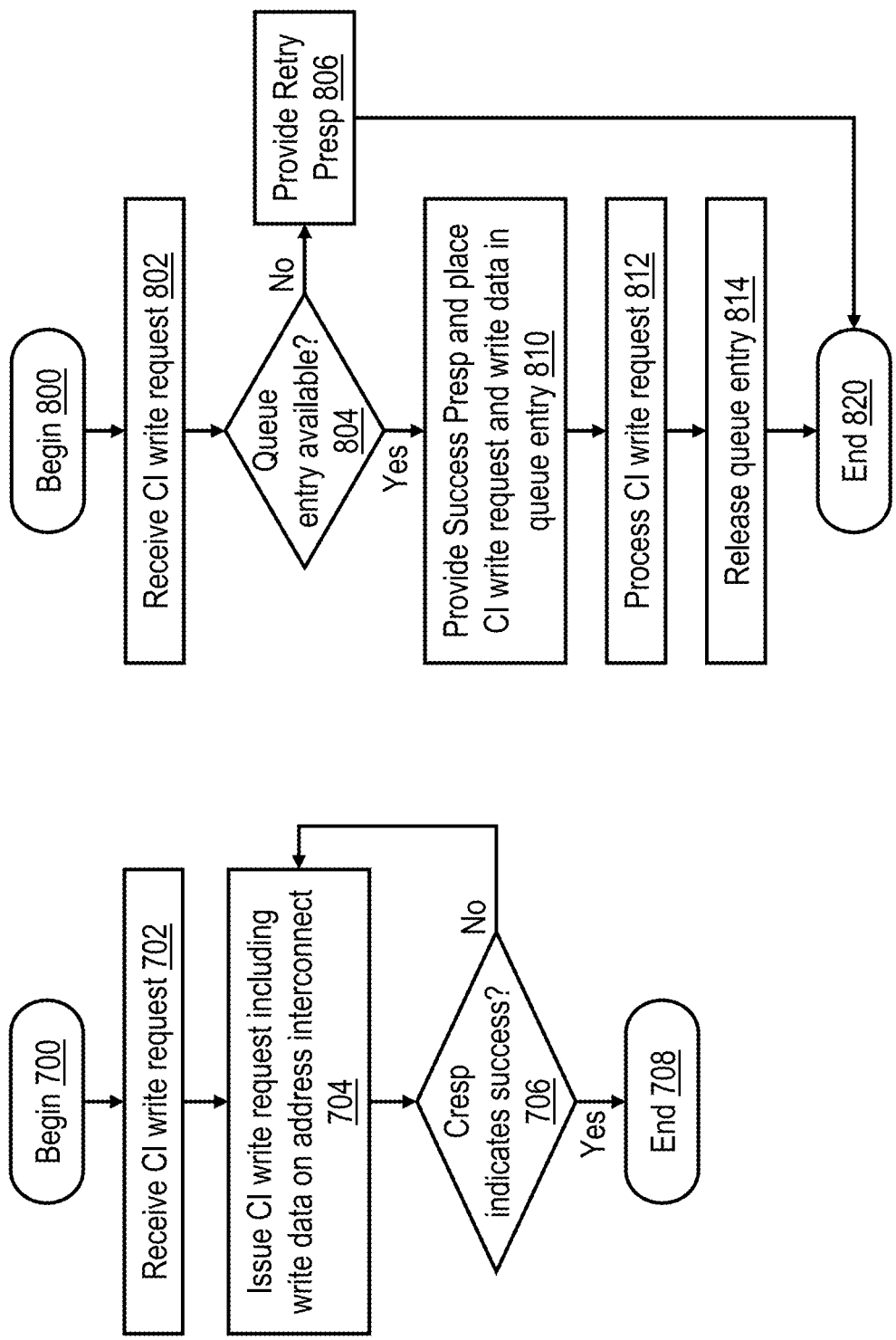
FIG. 7 is a high-level logical flowchart of an exemplary method by which an NCU issues, on a system interconnect of a data processing system, a CI write request in accordance with one embodiment.
FIG. 8 is a high-level logical flowchart of an exemplary method by which a destination device services a CI write request in accordance with one embodiment.

With reference now to FIG. 7 there is illustrated a high-level logical flowchart of an exemplary method by which an NCU issues, on a system interconnect of a data processing system, a CI write request in accordance with a first embodiment. To promote understanding, the method of FIG. 7 will be described with reference to exemplary data processing system 100 of FIG. 1 and the exemplary operation depicted in FIG. 3.

The process of FIG. 7 begins at block 700 and then proceeds to block 702, which illustrates an NST machine 150 of an NCU 146 receiving a CI write request from the associated processor core 120 via store bus 164 and NSQ 148. The CI write request is generated, for example, by execution of a corresponding store instruction by processor core 120 targeting a region of cache-inhibited memory, and includes at least a target address and write data.

In response to receipt of the CI write request, the NST machine 150 broadcasts the CI write request to all snoopers 304 coupled to system interconnect 104 via address interconnect 202 (block 704). As shown in FIG. 9A, the CI write request 900 includes at least a request type field 902 identifying the request as a CI write request, a master tag field 904 identifying the processing unit 102, NCU 146, and NST machine 150 issuing the CI write request, and an address field 906 specifying the target address received from the associated processor core 120. Unlike prior art CI write request 600 of FIG. 6A, CI write request 900 of FIG. 9A additionally includes the write data for the CI write operation in a data field 910, which in some embodiments can be communicated in an additional beat on broadcast address interconnect 202.

As before, in response to the CI write request, snoopers 304 within data processing system 100 provide respective partial responses (Presps) 306, as described above with reference to FIG. 3. These partial responses 306 are then logically combined by an instance of response logic 308 (e.g., residing in the issuing processing unit 102) to form a combined response (Cresp) 310 for the CI write request. Caching snoopers typically generate Null partial responses for cache-inhibited requests and perform no additional processing.

FIG. 9B illustrates an example of a format of a coherence response 920 that can be employed for both the Presps 306 and Cresp 310 of the CI write operation in accordance with one embodiment. Coherence response 920 includes a master tag field 922, which identifies the processing unit 102, NCU 146, and NST machine 150 issuing the CI write request. In addition, coherence response 610 includes a destination tag field 924, which for Presps 306 and for Cresp 310 of the CI write request indicates the snooper 304 (and more precisely, the destination device 200 and queue entry 212) that is the destination of the CI write data (e.g., memory controller 106 or host bridge 110). For Presps 306, destination tag field 614 is unaltered by snoopers 304 that are not the ultimate destination of the CI write data. It should be observed in FIGS. 7-8 that this destination tag field 924 is not utilized to direct delivery of the write data of the CI write operation. Coherence response 610 also includes a response field 926, which for Presps 306 indicates the accumulated coherence responses of snoopers 304 (i.e., the partial responses of snoopers 304 to a request can be ORed together within response field 616) and which for Cresp 310 indicates the systemwide coherence response to the CI write request. As in the prior art, the possible coherence responses indicated in response field 926 for the Cresp 310 of the CI write request include, for example, Success or Retry.

Returning to FIG. 7, at block 706 the NST machine 150 that issued the CI write request monitors for the associated Cresp 310 (as identified by master tag field 922 of the coherence response 920) and determines whether response field 926 of the Cresp 310 indicates success of the CI write request. If not (e.g., Cresp 310 indicates Retry in response field 926), the process returns to block 704, which illustrates NST machine 150 reissuing the CI write request on address interconnect 202. In response to NST machine 150 instead determining at block 706 that the Cresp 310 indicates success of the CI write request, NST machine 150 is deallocated, and the process of FIG. 7 ends at block 708. Thus, in this embodiment, NST machine 150 does not perform any steps corresponding to blocks 408-410 of the prior art method given in FIG. 4.

Referring now to FIG. 8, there is illustrated a high-level logical flowchart of an exemplary method by which a destination device 200 (e.g., memory controller 106 or host bridge 110) services a CI write request in accordance with the first embodiment. The process of FIG. 8 begins at block 800 and then proceeds to block 802, which illustrates the destination device 200 receiving a CI write request 900 specifying within address field 906 a target address for which the destination device 200 is responsible. In response to receipt of CI write request 900, destination device 200 determines whether or not a queue entry 212 is available in its request queue 210 for allocation to the CI write request 900 (block 804). If not, destination device 200 provides a Presp 306 indicating Retry in response field 926 (block 806). This Presp 306 will cause response logic 308 to generate a Cresp 310 also indicating Retry in response field 926. Following block 806, the process of FIG. 8 ends at block 820.

Returning to block 804, in response to a determination that an entry 212 is available in request queue 210 for allocation to the CI write request, destination device 200 provides a Presp 306 indicating Success in response field 926 and enqueues the CI write request in the available entry 212 by loading the address specified in address field 906 of CI write request 900 into address field 214, loading the contents of request type field 902 into request field 216, and loading an indication of the contents of data field 910 into data field 218 via selection logic 220 (block 810). In contrast to the process of FIG. 5, which requires the destination device 200 to wait for receipt of a separate data packet 620, in the process of FIG. 8 destination device 200 can immediately processes the CI write request, for example, by storing the data from data field 218 into system memory 108 or writing the data from data field 218 to an attached I/O device (block 812). Thereafter, destination device 200 releases the queue entry 212 allocated to the CI write request (block 814), and the process of FIG. 8 ends at block 820.

Referring now to FIG. 10, there is depicted a high-level logical flowchart of an exemplary method by which an NCU issues, on a system interconnect of a data processing system, a CI write request in accordance with a second embodiment. To promote understanding, the method of FIG. 10 will be described with reference to exemplary data processing system 100 of FIG. 1.

The process of FIG. 10 begins at block 1000 and then proceeds to block 1002, which illustrates an NST machine 150 of an NCU 146 receiving a CI write request from the associated processor core 120 via store bus 164 and NSQ 148. The CI write request is generated, for example, by execution of a corresponding store instruction by processor core 120 targeting a region of cache-inhibited memory, and includes at least a target address and write data.

In response to receipt of the CI write request, the NST machine 150 broadcasts a first request on address interconnect 202 (block 1004). As shown in FIG. 12A, in an exemplary embodiment, the first request 1200 includes at least a request type field 1202 identifying the request as a CI write request, a master tag A field 1204 identifying the processing unit 102, NCU 146, and NST machine 150 issuing the CI write request, and an address field 1206 specifying the target address received from the associated processor core 120. Thus, in this embodiment, first request 1200 can be the same as or similar to prior art CI write request 600 of FIG. 6A.

As before, in response to the first request 1200, snoopers 304 within data processing system 100 provide a partial response (Presp) 306 (which may be a Null response), as described above with reference to FIG. 3. These partial responses 306 are then logically combined, and an instance of response logic 308 (e.g., residing in the issuing processing unit 102) forms a combined response (Cresp) 310 for the CI write request based on the Presps 306.

FIG. 12B illustrates an exemplary format of a first coherence response 1210 that can be employed for both the Presps 306 and Cresp 310 generated for the first request 1200. Coherence response 1210 includes a master tag A field 1212, which specifies contents of master tag A field 1204 of first request 1200. In addition, first coherence response 1210 includes a destination tag field 1214, which for Presps 306 and for Cresp 310 of first request 1200 indicates the snooper 304 (and more precisely, the destination device 200 and queue entry 212) that is the destination of the CI write data (e.g., memory controller 106 or host bridge 110). For Presps 306, destination tag field 1214 is unaltered by snoopers 304 that are not the ultimate destination of the CI write data. It should be observed in FIGS. 10-11 that this destination tag field 1214 is not utilized to direct data delivery for the CI write operation. Coherence response 1210 also includes a response field 1216, which for Presps 306 indicates the accumulated coherence responses of snoopers 304 (i.e., the partial responses of snoopers 304 to a request can be ORed together within response field 616) and which for the Cresp 310 indicates the systemwide coherence response to first request 1200. As in the prior art, the possible coherence responses indicated in response field 1216 for the Cresp 310 of the first request 1200 include, for example, Success or Retry.

Returning to FIG. 10, at block 1006 the NST machine 150 broadcasts a second request on address interconnect 202 asynchronously to receipt by NST machine 150 of the Cresp 310 of first request 1200. As depicted in FIG. 12C, in an exemplary embodiment, the second request 1220 includes at least a request type field 1222 identifying the request as a CI write request, a master tag A' field 1224, and a data field 1226 specifying the write data of the CI write request. In a preferred embodiment, master tag A' field 1224, while also identifying the processing unit 102, NCU 146, and NST machine 150 issuing second request 1220, is preferably distinct from the contents of master tag A field 1204 and thus permits the relevant destination device 200 to distinguish between first request 1200, which provides the target address of the CI write request, and second request 1220, which provides the write data of the CI write request. Address interconnect 202 preferably ensures that first request 1200 and second request 1220 remain ordered such that destination device 200 receives first request 1200 prior to second request 1220.

Block 1008 of FIG. 8 illustrates the NST machine 150 monitoring for the Cresp 310 of first request 1200 (as identified by master tag A field 1210 of the coherence response 1210) and determining whether response field 1216 of the Cresp 310 indicates success of first request 1200. If not (e.g., Cresp 310 indicates Retry in response field 1216), the process passes to block 1010, which illustrates NST machine 150 awaiting receipt of the Cresp 310 of second request 1220 prior to reissuing the first request 1200 at block 1004. If, however, NST machine 150 determines at block 1008 that the Cresp 310 of first request 1200 indicates Success, NST machine 150 awaits receipt of the Cresp 310 of second request 1220, which can take the form of coherence response 1230 of FIG. 12D (block 1012). In this example, coherence response 1230 includes a master tag A' field 1232, destination tag field 1234, and response field 1236 respectively corresponding to fields 1212, 1214, and 1216 discussed above. In response to receipt of the Cresp of second request 1220, NST machine 150 is deallocated, and the process of FIG. 10 ends at block 1020.

With reference now to FIG. 11, there is illustrated a high-level logical flowchart of an exemplary method by which a destination device 200 (e.g., memory controller 106 or host bridge 110) services a CI write request in accordance with the second embodiment. The process of FIG. 11 begins at block 1100 and then proceeds to block 1102, which illustrates the destination device 200 receiving a first request 1200 specifying within address field 1206 a target address for which the destination device 200 is responsible. In response to receipt of the first request 1200, destination device 200 determines whether or not a queue entry 212 is available in its request queue 210 for allocation to a CI write request (block 1104). If not, destination device 200 provides a Presp 306 indicating Retry in response field 1216 (block 1106). This Presp 306 will cause response logic 308 to generate a Cresp 310 also indicating Retry in response field 1216. Following block 1106, the process of FIG. 11 ends at block 1120.

Returning to block 1104, in response to a determination that an entry 212 is available in request queue 210 for the CI write request, destination device 200 provides a Presp 306 indicating Success in response field 1216 and enqueues a CI write request in the available entry 212 by loading the address specified in address field 1206 of first request 1200 into address field 214 and loading an indication of the contents of request type field 1202 into request field 216 (block 1110).

As shown at block 1112, destination device 200 then monitors for receipt of the write data of the CI write request in a second request 1220 on address interconnect 202. In response to receipt of second request 1220, destination device 200 provides a Null Presp 306, extracts the data from data field 1226, and loads the data into data field 218 of the relevant queue entry 212 via selection logic 220 (block 1114). Destination device 200 then processes the CI write request, for example, by storing the data from data field 218 into system memory 108 or writing the data from data field 218 to an attached I/O device (block 1116). Thereafter, destination device 200 releases the queue entry 212 (block 1118), and the process of FIG. 11 ends at block 1120.

Figure 13:
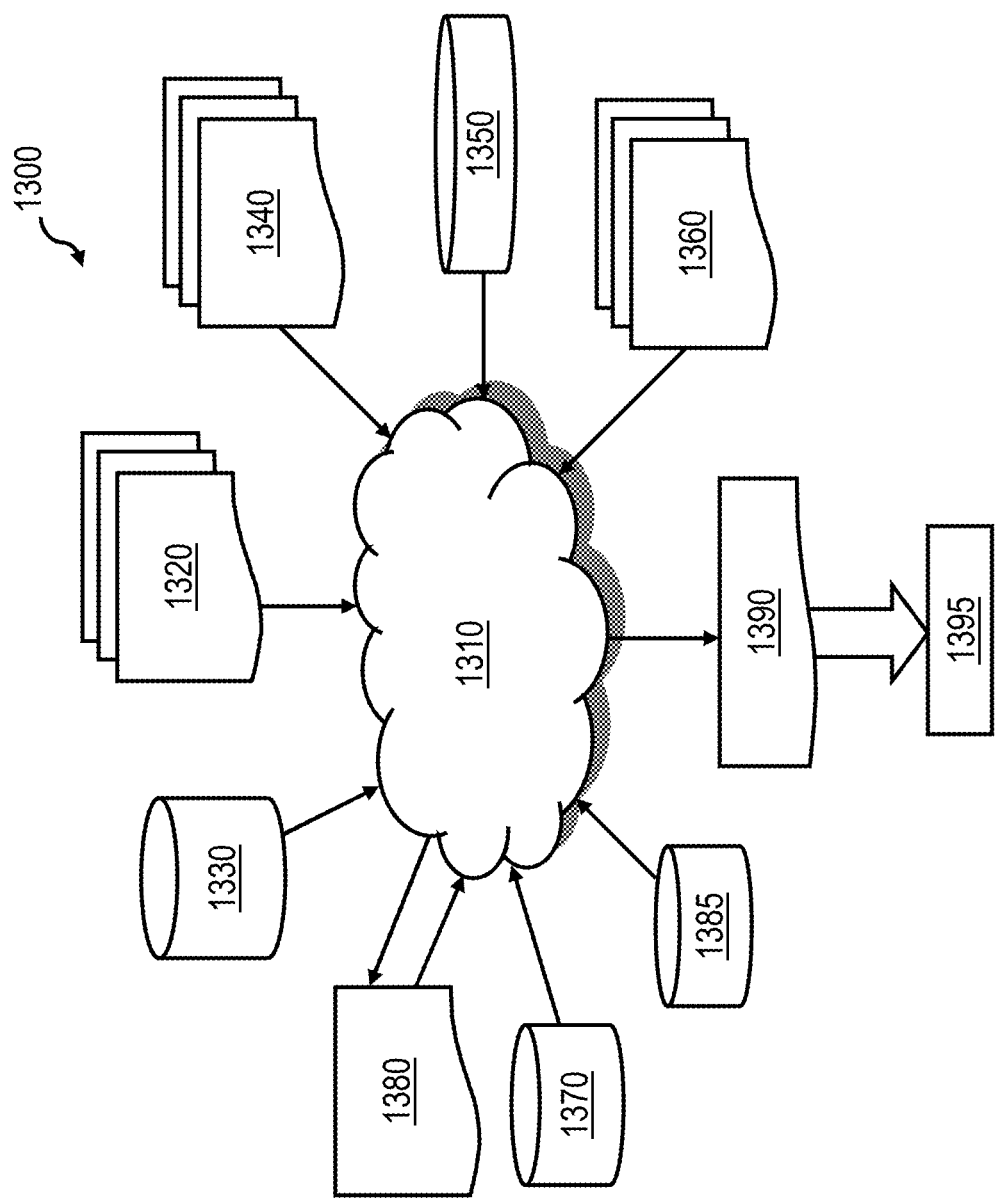
FIG. 13 is a block diagram of an exemplary design flow.

With reference now to FIG. 13, there is illustrated a block diagram of an exemplary design flow 1300 used for example, in semiconductor IC logic design, simulation, test, layout, and manufacture. Design flow 1300 includes processes, machines and/or mechanisms for processing design structures or devices to generate logically or otherwise functionally equivalent representations of the design structures and/or devices described above and shown herein. The design structures processed and/or generated by design flow 1300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1300 may vary depending on the type of representation being designed. For example, a design flow 1300 for building an application specific IC (ASIC) may differ from a design flow 1300 for designing a standard component or from a design flow 1300 for instantiating the design into a programmable array, for example a programmable gate array (PGA) or a field programmable gate array (FPGA) offered by Altera® Inc. or Xilinx® Inc.

FIG. 13 illustrates multiple such design structures including an input design structure 1020 that is preferably processed by a design process 1310. Design structure 1320 may be a logical simulation design structure generated and processed by design process 1310 to produce a logically equivalent functional representation of a hardware device. Design structure 1320 may also or alternatively comprise data and/or program instructions that when processed by design process 1310, generate a functional representation of the physical structure of a hardware device. Whether representing functional and/or structural design features, design structure 1320 may be generated using electronic computer-aided design (ECAD) such as implemented by a core developer/designer. When encoded on a machine-readable data transmission, gate array, or storage medium, design structure 1320 may be accessed and processed by one or more hardware and/or software modules within design process 1310 to simulate or otherwise functionally represent an electronic component, circuit, electronic or logic module, apparatus, device, or system such as those shown herein. As such, design structure 1320 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1310 preferably employs and incorporates hardware and/or software modules for synthesizing, translating, or otherwise processing a design/simulation functional equivalent of the components, circuits, devices, or logic structures shown herein to generate a netlist 1380 which may contain design structures such as design structure 1320. Netlist 1380 may comprise, for example, compiled or otherwise processed data structures representing a list of wires, discrete components, logic gates, control circuits, I/O devices, models, etc. that describes the connections to other elements and circuits in an integrated circuit design. Netlist 1380 may be synthesized using an iterative process in which netlist 1380 is resynthesized one or more times depending on design specifications and parameters for the device. As with other design structure types described herein, netlist 1380 may be recorded on a machine-readable storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, or buffer space.

Design process 1310 may include hardware and software modules for processing a variety of input data structure types including netlist 1380. Such data structure types may reside, for example, within library elements 1330 and include a set of commonly used elements, circuits, and devices, including models, layouts, and symbolic representations, for a given manufacturing technology (e.g., different technology nodes, 32 nm, 45 nm, 100 nm, etc.). The data structure types may further include design specifications 1340, characterization data 1350, verification data 1360, design rules 1390, and test data files 1385 which may include input test patterns, output test results, and other testing information. Design process 1310 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1310 without deviating from the scope and spirit of the invention. Design process 1310 may also include modules for performing standard circuit design processes such as timing analysis, verification, design rule checking, place and route operations, etc.

Design process 1310 employs and incorporates logic and physical design tools such as HDL compilers and simulation model build tools to process design structure 1320 together with some or all of the depicted supporting data structures along with any additional mechanical design or data (if applicable), to generate a second design structure 1390. Design structure 1390 resides on a storage medium or programmable gate array in a data format used for the exchange of data of mechanical devices and structures (e.g., information stored in a IGES, DXF, Parasolid XT, JT, DRG, or any other suitable format for storing or rendering such mechanical design structures). Similar to design structure 1320, design structure 1390 preferably comprises one or more files, data structures, or other computer-encoded data or instructions that reside on transmission or data storage media and that when processed by an ECAD system generate a logically or otherwise functionally equivalent form of one or more of the embodiments of the invention shown herein. In one embodiment, design structure 1390 may comprise a compiled, executable HDL simulation model that functionally simulates the devices shown herein.

Design structure 1390 may also employ a data format used for the exchange of layout data of integrated circuits and/or symbolic data format (e.g., information stored in a GDSII (GDS2), GL1, OASIS, map files, or any other suitable format for storing such design data structures). Design structure 1390 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown herein. Design structure 1390 may then proceed to a stage 1395 where, for example, design structure 1390: proceeds to tape-out, is released to manufacturing, is released to a mask house, is sent to another design house, is sent back to the customer, etc.

As has been described, in at least one embodiment, A data processing system includes multiple processing units coupled to a system interconnect including a broadcast address interconnect and a data interconnect. The processing unit includes a processor core that executes memory access instructions and a cache memory, coupled to the processor core, which is configured to store data for access by the processor core. The processing unit is configured to broadcast, on the address interconnect, a cache-inhibited write request and write data for a destination device coupled to the system interconnect. In various embodiments, the initial cache-inhibited request and the write data can be communicated in the same or different requests on the address interconnect.

While various embodiments have been particularly shown and described, it will be understood by those skilled in the art that various changes in form and detail may be made therein without departing from the spirit and scope of the appended claims and these alternate implementations all fall within the scope of the appended claims.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Further, although aspects have been described with respect to a computer system, it should be understood that present invention may alternatively be implemented as a program product including a computer-readable storage device storing program code that can be processed by a data processing system. The computer-readable storage device can include volatile or non-volatile memory, an optical or magnetic disk, or the like. However, as employed herein, a "storage device" is specifically defined to include only statutory articles of manufacture and to exclude signal media per se, transitory propagating signals per se, and energy per se.

The program product may include data and/or instructions that when executed or otherwise processed on a data processing system generate a logically, structurally, or otherwise functionally equivalent representation (including a simulation model) of hardware components, circuits, devices, or systems disclosed herein. Such data and/or instructions may include hardware-description language (HDL) design entities or other data structures conforming to and/or compatible with lower-level HDL design languages such as Verilog and VHDL, and/or higher level design languages such as C or C++. Furthermore, the data and/or instructions may also employ a data format used for the exchange of layout data of integrated circuits and/or symbolic data format (e.g. information stored in a GDSII (GDS2), GL1, OASIS, map files, or any other suitable format for storing such design data structures).

What is claimed is:

1. A processing unit for a data processing system including a system interconnect having a broadcast address interconnect and a data interconnect, the processing unit comprising:

a processor core that executes memory access instructions;

a cache memory coupled to the processor core, wherein the cache memory is configured to store data for access by the processor core; and wherein the processing unit is configured to broadcast, on the address interconnect, a cache-inhibited write request and write data of the cache-inhibited write request for a destination device among a plurality of destination devices coupled to the system interconnect, and wherein the processing unit is configured to broadcast the cache-inhibited write request without specifying a destination tag identifying the destination device.

2. The processing unit of claim 1, wherein the processing unit broadcasts the cache-inhibited write request in a first beat on the address interconnect and broadcasts the write data in a second beat on the address interconnect.

3. The processing unit of claim 1, wherein the processing unit is configured to broadcast the write data within the cache-inhibited write request.

4. The processing unit of claim 1, wherein:
the cache-inhibited write request is a first request; and
the processing unit is configured to broadcast the write data of the cache-inhibited write request in a different second request on the address interconnect.

5. A data processing system, comprising:
the multiple processing units, including the processing unit of claim 1;
the destination device; and
the system interconnect communicatively coupling the destination device and the multiple processing units.

6. The data processing system of claim 5, wherein the destination device comprises a memory controller of a system memory of the data processing system.

7. The data processing system of claim 5, wherein the destination device comprises an interconnect bridge.

8. The data processing system of claim 5, wherein the data interconnect is a point-to-point interconnect and the address interconnect is a broadcast interconnect.

9. A method of data processing in a processing unit of a data processing system including multiple processing units coupled to a system interconnect having a broadcast address interconnect and a data interconnect, the method comprising:
the processing unit receiving a cache-inhibited write request and write data of the cache-inhibited write request from a processor core of the processing unit; and
in response to receipt of the cache-inhibited write request, the processing unit broadcasting, on the address interconnect of the data processing system, the cache-inhibited write request and the write data of the cache-inhibited write request for a destination device among a plurality of destination devices coupled to the system interconnect without specifying a destination tag identifying the destination device.

10. The method of claim 9, wherein the broadcasting includes broadcasting the cache-inhibited write request in a first beat on the address interconnect and broadcasting the write data in a second beat on the address interconnect.

11. The method of claim 9, wherein the broadcasting includes the processing unit broadcasting the write data within the cache-inhibited write request.

12. The method of claim 9, wherein:
the cache-inhibited write request is a first request; and
the broadcasting includes the processing unit broadcasting the write data of the cache-inhibited write request in a different second request on the address interconnect.

13. The method of claim 9, wherein the destination device is one of a set including a memory controller of a system memory of the data processing system and an interconnect bridge.

14. A design structure tangibly embodied in a machine-readable storage device for designing, manufacturing, or testing an integrated circuit, the design structure comprising:
a processing unit for a data processing system including system interconnect having a broadcast address interconnect and a data interconnect, the processing unit including:
a processor core that executes memory access instructions;
a cache memory coupled to the processor core, wherein the cache memory is configured to store data for access by the processor core; and
wherein the processing unit is configured to broadcast, on the address interconnect, a cache-inhibited write request and write data of the cache-inhibited write request for a destination device among a plurality of destination devices coupled to the system interconnect, and wherein the processing unit is configured to broadcast the cache-inhibited write request without specifying a destination tag identifying the destination device.

15. The design structure of claim 14, wherein the processing unit broadcasts the cache-inhibited write request in a first beat on the address interconnect and broadcasts the write data in a second beat on the address interconnect.

16. The design structure of claim 13, wherein the processing unit is configured to broadcast the write data within the cache-inhibited write request.

17. The design structure of claim 13, wherein:
the cache-inhibited write request is a first request; and
the processing unit is configured to broadcast the write data of the cache-inhibited write request in a different second request on the address interconnect.

* * * * *